United States Patent
Saito (10) Patent No.: US 7,932,662 B2
(45) Date of Patent: Apr. 26, 2011

(54) CRYSTAL DEVICES AND METHODS FOR MANUFACTURING SAME

(75) Inventor: Takefumi Saito, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 62 days.

(21) Appl. No.: 12/352,514

(22) Filed: Jan. 12, 2009

(65) Prior Publication Data

US 2009/0179524 A1   Jul. 16, 2009

(30) Foreign Application Priority Data

Jan. 15, 2008   (JP) .................. 2008-005228

(51) Int. Cl.
*H01L 41/08* (2006.01)
(52) U.S. Cl. ...................... 310/344; 310/367
(58) Field of Classification Search .......... 310/344, 310/348
See application file for complete search history.

(56) References Cited

U.S. PATENT DOCUMENTS

| | | | | |
|---|---|---|---|---|
| 4,405,875 | A * | 9/1983 | Nagai | 310/344 |
| 4,639,631 | A * | 1/1987 | Chason et al. | 310/344 |
| 6,507,139 | B1 * | 1/2003 | Ishino et al. | 310/348 |
| 6,606,772 | B1 | 8/2003 | Nohara et al. | |
| 2008/0231145 | A1 * | 9/2008 | Nagano et al. | 310/344 |

FOREIGN PATENT DOCUMENTS

| | | |
|---|---|---|
| EP | 0648014 A2 | 4/1995 |
| JP | 06-164152 | 6/1994 |
| JP | 06-343017 | 12/1994 |
| JP | 08-335839 | 12/1996 |
| JP | 10-022773 | 1/1998 |
| JP | 2001-160661 | 6/2001 |
| JP | 2003-087078 | 3/2003 |
| JP | 2003-133897 | 5/2003 |
| JP | 2004-254160 | 9/2004 |
| JP | 2006-042096 | 2/2006 |
| JP | 2007-209022 | 8/2007 |
| JP | 2007-243378 | 9/2007 |

OTHER PUBLICATIONS

Extended European Search Report for corresponding European Application No. 09150473.8, European Patent Office, Oct. 16, 2009, 4 pages.
Tong et al., "Low Temperature Wafer Direct Bonding," *J. Microelectromech. Syst.*, 3(1):29-35 (1994).
Office Action issued in corresponding JP Patent Application No. JP 2008-005228.

* cited by examiner

*Primary Examiner* — Mark Budd
(74) *Attorney, Agent, or Firm* — Klarquist Sparkman, LLP (57) ABSTRACT

Crystal devices are disclosed that include a crystal frame having a crystal vibrating piece and an outer frame. The crystal vibrating piece includes excitation electrodes, and the outer frame supports the crystal vibrating piece. Each device has a base including connection electrodes on a first surface thereof and respective external electrodes on a second surface thereof, wherein the connection electrodes are electrically connected via respective through-holes to respective excitation electrodes and to respective external electrodes. The first surface of the base is bonded to the under-surface of the outer frame, and an upper surface of the outer frame is bonded to a crystal lid. The through-holes have non-circular transverse profiles and are filled with a sealing material such as a metal.

10 Claims, 6 Drawing Sheets

CRYSTAL DEVICES AND METHODS FOR MANUFACTURING SAME

CROSS-REFERENCE TO RELATED APPLICATION

This application claims priority to, and the benefit of, Japan Patent Application No. 2008-005228, filed on Jan. 15, 2008, in the Japan Patent Office, the disclosure of which is incorporated herein by reference in its entirety.

FIELD

This disclosure is directed to, inter alia, crystal devices in which crystal (e.g., piezoelectric quartz crystal) is used for fabricating substantially all the portions thereof, such as frames, lids, and bases. The disclosure is also directed to methods for manufacturing such crystal devices. More specifically, the disclosure is directed, in the context of such crystal devices, particular configurations of through-holes (penetrating electrodes) and how to make them.

DESCRIPTION OF THE RELATED ART

With the progress of miniaturization and/or increases in the operating frequency of mobile communication apparatus and office automation (OA) equipment, crystal devices used in this equipment must be progressively smaller and/or operate at higher frequency.

A conventional crystal device comprises a body portion to which a crystal vibrating piece is mounted. The device also comprises electrodes to which electrical terminals of the crystal vibrating piece are connected. The device also comprises external connection terminals formed on the body portion, wiring conductors that connect the electrodes to the external connection terminals, and hermetically sealed through-holes for the wiring conductors passing through the body portion. The body portion includes a lid and a package, both made of ceramic, configured as respective layers that are bonded together. The sealed through-holes are at the bottom of the package. The seals are formed in a vacuum environment, in which the through-holes are filled with a sealing material and heated to melt the sealing material. The melted sealing material fills the though-holes and thus hermetically seals them. Crystal devices having such a configuration are disclosed in Japan Unexamined Patent Application No. 2003-133897 and are commonly known. Furthermore, Japan Unexamined Patent Application No. 2006-042096 discusses sealing the through-holes. Specifically, a supporting board, used for connecting the crystal vibrating piece electrically, is positioned on the base portion to which the crystal vibrating piece is mounted, and portions of the through-holes are blocked by the supporting board.

Further with respect to the JP '897 reference, the wiring conductors of the crystal device are formed on connection areas of an insulating layer. The connection areas become progressively smaller and the package frame becomes thinner with increased miniaturization of the crystal devices. As a result, wiring conductors formed between insulating layers occupy proportionally more space between the insulating layers, which increases the possibility of outside air penetrating via the spaces into the interior of the package. In other words, increased miniaturization may increase problems involving loss of the air-tightness of the package.

In the sealing process of the JP '096 reference, sealing material added to the through-holes is melted to fill them. But, the molten sealing material actually does not completely fill the through-holes completely, leaving very tiny spaces in them. The spaces allow air to invade into the package due to the lower air-tightness of the package.

In view of the problems summarized above, the present invention provides crystal devices of which the packages maintain their air-tightness as a result of changing the shape of the through-holes. The altered shape of the through-holes allows them to be filled completely with melted sealing material. The invention also provides methods for manufacturing crystal devices of which a part of the package and the crystal vibrating piece are made uniformly of a crystal material. The lids and bases are also made of the crystal material, and these parts are bonded together by siloxane bonds (Si—O—Si).

SUMMARY

The invention has several aspects, of which a first aspect is directed to crystal devices that comprise a crystal frame, a crystal base, and a crystal lid hermetically bonded to each other. The crystal frame includes a crystal vibrating piece surrounded by and coupled to an outer frame, and includes a first surface (e.g., upper surface) and second surface (e.g., lower surface). The crystal frame also includes excitation electrodes on the crystal vibrating piece. The crystal base has first and second surfaces, wherein the second surface is a "reverse" surface to the first surface. The crystal base includes connection electrodes formed on the first surface and external electrodes formed on the second surface. The external electrodes are electrically connected to the connection electrodes via conductive through-holes extending through the thickness of the base. When the first surface of the base is bonded to the crystal frame, the connection electrodes become connected to respective excitation electrodes. The crystal lid is bonded to the first surface of the crystal frame. The through-holes have a non-circular transverse section and are filled with a sealing material such as metal.

The through-holes receive the sealing material by melting the sealing material and then adding the melt to the through-holes. As a result of the non-circular transverse sections of the through-holes, the molten sealing material flows throughout the through-holes by capillary action. Thus, air-tightness of the package of the crystal device is achieved and maintained because of the improved flow of sealing material throughout the through-holes having non-circular transverse sections.

Various embodiments are directed to different respective shapes of the transverse sections of the through-holes. In general, the transverse sections are non-circular. In certain embodiments the transverse section is multi-angular, such as polygonal or any of various "star" shapes. These multi-angular and star shapes facilitate flow of melted sealing material throughout the through-holes by capillary action. Example polygonal shapes are triangular, quadrangular, pentagonal, hexagonal, heptagonal, and octagonal. The polygonal profiles provide multiple interior angles that facilitate capillary flow of melted sealing material. "Star"-shaped transverse profiles have any of various numbers of "points," such as but not limited to trigram (three-pointed), quad-gram (four-pointed), pentagram (five-pointed), hexagram (six-pointed), heptagram (seven pointed), and octagram (eight-pointed). Star-shaped profiles have not only the interior angles of each of the points but also the angles between points, both of which facilitating flow of melted sealing material by capillary action.

The transverse profile of the through-holes can be the same throughout or can be differently shaped or sized on the first surface of the base relative to the second surface of the base. For example, the profile can be a larger pentagram or hexagon on the second surface and a smaller pentagram or hexagon on the first surface. Alternatively, for example, the profile can be triangular on the first surface and hexagonal on the second surface. Other combinations are also possible. The change in profile from the first surface to the second surface is made in the through-holes. Again, these features facilitate good capillary flow of the sealing material.

A desired manner of bonding the crystal lid, crystal frame, and crystal base together is siloxane bonding.

The crystal lid, frame, and base desirably are all made of the same crystal material, such as quartz crystal. By making these parts all of the same crystal material, they all have identical coefficients of thermal expansion. Thus, the crystal devices formed of these parts have excellent resistance to thermal damage. Also, the crystal devices have much greater resistance to becoming defective over time.

In certain embodiments, one or both the crystal lid and crystal base have respective concavities, wherein the crystal vibrating piece is situated in the space defined between the concavity in the base and the concavity in the lid. The concavities alleviate the need to make the crystal vibrating piece thinner than the outer frame in order to provide sufficient space for the arms to oscillate.

The through-holes and connection electrodes desirably comprise respective metal films. In certain embodiments the metal film comprises a sub-layer of a first metal, and a top layer of a second metal formed on the sub-layer. In any event, the sealing material fills the through-holes to seal them. Example top layers are gold and silver. Forming metal films in the through-holes facilitates flow of molten sealing material throughout the through-holes by capillary action.

According to another aspect, manufacturing methods are provided for making crystal devices. The methods include forming a plurality of crystal lids on a first crystal wafer. On a second crystal wafer are formed a plurality of crystal frames each having a respective crystal vibrating piece, respective electrodes, and an outer frame supporting the crystal vibrating pieces. On a third crystal wafer are formed a plurality of crystal bases each having connection electrodes formed on a first surface thereof and respective external electrodes formed on a second surface thereof, wherein the second surface is a reverse surface relative to the first surface. The external electrodes and respective connection electrodes are electrically connected together by respective through-holes. The first, second, and third wafers are layered in a sandwich manner in which the crystal frames are situated between respective lids and bases. The three wafers are bonded together by, e.g., siloxane bonding to form multiple crystal devices simultaneously. Upon completion of bonding, the through-holes are sealed by introducing sealing material (e.g., a metal such as silver or gold) to each through-hole. Finally, the completed devices are cut from the three-wafer sandwich at the respective connections of the lid, frame, and base to the respective wafers. According to this manufacturing method, multiple crystal devices are manufactured simultaneously, which is advantageous for mass-production of the devices. Since the lid, frame, and base wafers all have identical coefficients of thermal expansion, the three wafers can be aligned and bonded easily.

As noted, in crystal devices as described herein, the through-holes have non-circular transverse sections such as polygonal or star-shaped. Through-holes having such profiles facilitate flow of melted sealing material throughout the through-holes, which facilitates the production of packaged devices of which the interiors are hermetically sealed from outside air.

Also, the subject crystal devices comprise crystal lids and bases that are easy to manufacture. In addition, electrodes are connected together as required during bonding of the lids and bases to respective frames. Thus, mass-manufacturing is achieved with less cost.

DETAILED DESCRIPTION

General Configuration of Crystal Vibrating Device

Figure 1A:
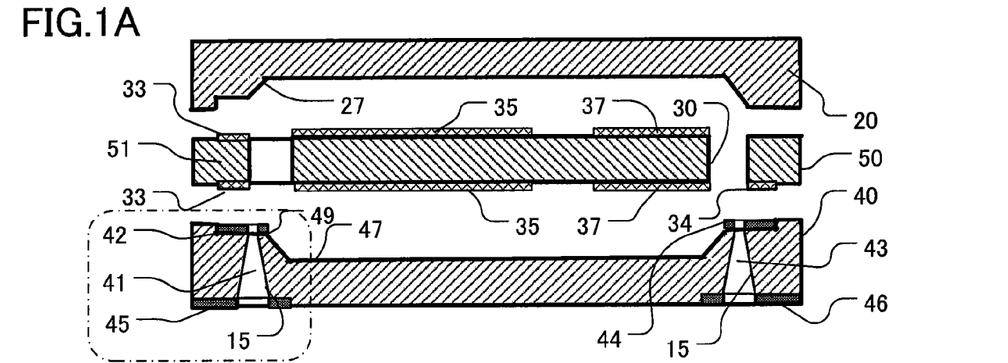
FIG. 1A is a schematic elevational section of an embodiment of a crystal vibrating device 100, as viewed along the line a-a in FIG. 1B and showing the lid 20, the crystal frame 50 (with crystal vibrating piece 30), the base 40, and through-holes 41, 43.
Figure 1B:
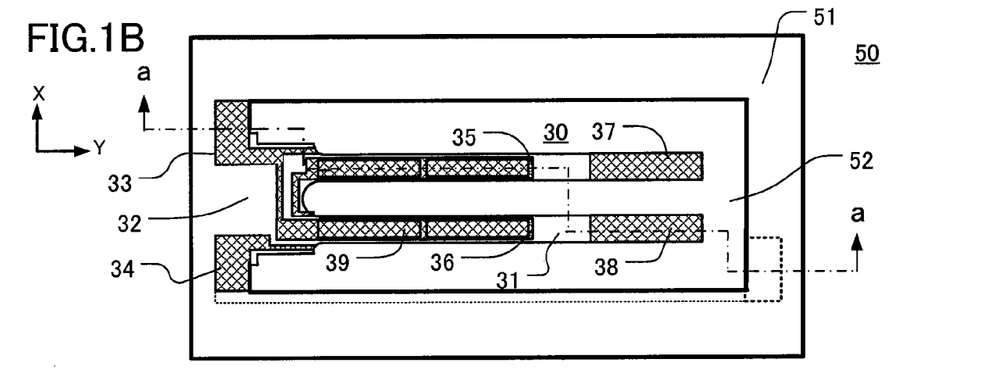
FIG. 1B is a top plan view of the crystal frame 50 including the crystal vibrating piece 30, of the device shown in FIG. 1A.
Figure 1C:
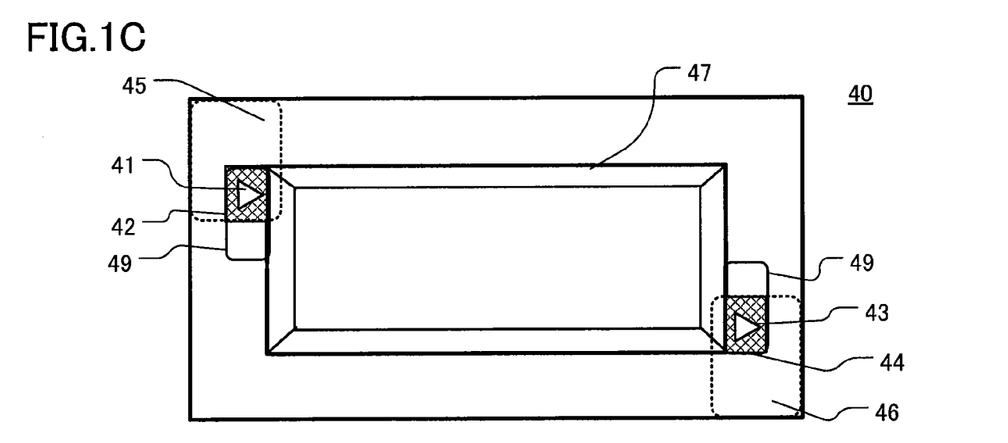
FIG. 1C is a top plan view of the base 40 of the device of FIG. 1A.

An embodiment of a crystal vibrating device 100 is described with reference to the FIGS. 1A-1C. FIGS. 1A-1C are respective schematic views of the crystal vibrating device 100. FIG. 1A is an elevational section along the line a-a in FIG. 1B, showing the lid 20, the frame 50, the crystal vibrating piece 30, and the base 40. For clarity, FIG. 1A shows items 20, 50, and 40 before being bonded together. FIG. 1B is a top plan view showing the frame 50 and crystal vibrating piece 30, and FIG. 1C is a top plan view of the base 40 shown in FIG. 1A. In FIG. 1A the crystal vibrating device 100 comprises a lid 20 serving as a package top, a base 40 serving as a package bottom, and a crystal frame 50 situated between the lid and base and serving as a center layer of the package. The lid 20 has a concavity 27 formed by etching on a surface thereof facing the crystal frame 50. The base 40 has a concavity 47 formed by etching on a surface thereof facing the crystal frame 50. The crystal frame 50 includes a tuning-fork type piezoelectric vibrating piece 30 formed by etching. The surface of the crystal frame 50 facing the lid 20 is a "first" surface, and the surface of the crystal frame facing the base 40 is a "second" surface that is a "reverse" surface to the first surface. Normally, the first surface faces upward and the second surface faces downward.

The crystal vibrating device 100 is formed of the crystal frame 50 (including the crystal vibrating piece 30) as a center layer, the base 40 bonded to the crystal frame 50 as a bottom package layer, and the lid 20 bonded to the crystal frame as a top package layer. The lid 20 and base 40 are bonded tightly and in a sealed manner to the first and second surfaces, respectively, of the crystal frame 50 by siloxane bonding (Si—O—Si). Thus, the crystal frame 50 is a middle package layer.

As shown in FIG. 1B, the crystal frame 50 comprises the tuning-fork type crystal vibrating piece 30 and an outer frame 51 that surrounds the crystal vibrating piece 30. A space 52 is defined between the tuning-fork type crystal vibrating piece 30 and the outer frame 51. The space 52 defines the outline profile of the crystal vibrating piece 30 and is formed by etching of the crystal material. The tuning-fork type crystal vibrating piece 30 comprises a base portion 32 from which a pair of vibrating arms 31 extends. The base portion 32 effectively couples the vibrating arms 31 to the outer frame 51 and thus configures the base portion 32 and the outer frame 51 as an integral unit. The base portion 32 also includes a first base electrode 33 and a second base electrode 34. Each of these base electrodes 33, 34 are situated on both the first surface (upward-facing surface) and the second surface (downward-facing surface) of the base portion 32 and outer frame 51. See FIG. 1A.

First and second excitation electrodes 35, 36 are situated on the first and second surfaces of the crystal vibrating piece 30, respectively. The first excitation electrode 35 is connected to the first base electrode 33, and the second excitation electrode 36 is connected to the second base electrode 34. "Weights" (respective metal layers) 37, 38 are formed on the tips of the vibrating arms 31 of the crystal vibrating piece 30. The first and second base electrodes 33, 34, the first and second excitation electrodes 35, 36, and the weights 37, 38 are formed simultaneously in a single photolithography step. Whenever voltage is being applied to the excitation electrodes 35, 36 via the base electrodes 33, 34, the crystal vibrating piece 30 oscillates at a designated frequency. The weights 37, 38 allow the vibrating arms 31 to oscillate easily and also allow for frequency adjustment. On each of the first and second main surfaces (upper and lower surfaces) of each vibrating arm 31 is a respective concavity 39. The concavities 39 lower the CI (crystal impedance) value of the crystal vibrating piece 30.

FIG. 1C shows the base 40, of which the concavity 47, a first through-hole 41, a second through-hole 43, and steps 49 are formed simultaneously in an etching step. The base 40 includes first and second connection electrodes 42, 44. The first and second connection electrodes 42, 44 are formed on respective steps 49.

Each of the first and second through-holes 41, 43 is lined with a metal film 15. The metal films 15 are formed during formation of the first and second connection electrodes 42, 44, in a photolithography step. Desirably, each metal film 15 comprises a first, or foundation, metal layer of chromium (Cr), nickel (Ni), or titanium (Ti), formed by sputtering, and a second metal layer of gold (Au) or silver (Ag). The base 40 includes first and second external electrodes 45, 46, formed by metallization on the under-surface of the base. The first connection electrode 42 is connected to the first external electrode 45 via the first through-hole 41. The second connection electrode 44 is connected to the second external electrode 46 via the second through-hole 43. In this embodiment the first and second through-holes 41, 43 each have a triangular transverse profile on the frame side and have a hexagonal transverse profile on the under-surface of the base 40.

The lid 20, base 40, and crystal frame 50 are sandwiched and bonded together by siloxane bonding. In preparation for siloxane bonding, the base 40 is placed beneath the frame 50, with the concavity 47 of the base facing the crystal vibrating piece 30, and the lid 20 is placed over the frame 50 with its concavity 27 facing the crystal vibrating piece 30. The resulting three-layer sandwich is heated in a high-temperature vessel within the range of 200 to 400° C. to bond the materials of the layers together, thereby completing packaging of the crystal vibrating piece.

The concavities 27, 47 are formed on respective surfaces of the lid 20 and base 40 in this embodiment. This is not intended to be limiting. Specifically, it is not necessary to form the concavities on the lid 20 and base 40. If the respective spaces between the crystal vibrating piece 30 and the lid 20, and between the crystal vibrating piece 30 and the base 40 can be formed so as not to interfere with oscillation of the crystal vibrating piece 30, then the concavities are unnecessary. For example, if the crystal vibrating piece 30 is made thinner than the frame 50, then the lid 20 and base 40 can be planar, without a need for the concavities. During siloxane bonding of the lid 20 and base 40 to the crystal frame 50, bonding of the first and second base electrodes 33, 34 and to the first and second connection electrodes 42, 44 occurs simultaneously.

This embodiment comprises the steps 49, which are desirable especially if they are formed properly. If one attempted to bond together the crystal frame 50 and base 40 without steps 49, then the base electrodes on the crystal frame 50 and the connection electrodes on the base 40 would be bonded together, but there would be no assurance that the lower surface of the crystal frame 50 and the upper surface of the base 40 would also be bonded together. If one attempted to bond together the crystal frame 50 and base 40 with steps 49 present but providing excessive space therebetween (e.g., space≧3000 to 4000 Ångstroms, the total thickness of the base electrode and connecting electrode), then the frame 50 and base 40 would be bonded together by siloxane bonds, but there would be no assurance that the first and second base electrodes 33, 34 would be also be connected to the first and second connection electrodes 42, 44, respectively.

After completing siloxane bonding of the frames, lids, and bases, metal is added to the through-holes 41, 43 in the base 40. Specifically, gold or silver filling (made by firing gold or silver paste, gold-tin (Au—Sn) alloy, gold-germanium (Au—Ge) alloy, or gold-silicon (Au—Si) alloy) is added to the first and second through-holes 41, 43. To seal the through-holes 41, 43 with the fillings, the crystal device is placed in a vacuum or inert gas environment in a reflow furnace. Furnace temperature depends upon the filling material. For example, if the filling is gold-tin alloy, the temperature of the reflow furnace is 300° C. since the melting point of the alloy is 280° C. If the filling is gold-silicon alloy, the temperature of the furnace is 380° C. since the melting point of gold-silicon is 363° C. Thus, manufacture of a crystal oscillator 100, for example, having a package filled with inert gas or a vacuum is completed.

Because the lid 20, crystal vibrating piece 30, and base 40 are all made of crystal material (e.g., quartz crystal), in the finished package all three pieces have identical coefficients of thermal expansion and respond similarly to changes in environmental temperature, including rapid changes. This prevents warping of one piece relative to another in the reflow furnace, and assures good tight bonds. In conventional vibrating devices, these pieces are made of different materials. Consequently, in the reflow furnace, unwanted spaces can form between the pieces being bonded because each piece has a different coefficient of thermal expansion.

Exemplary Shape of Through Holes

Figure 2A:
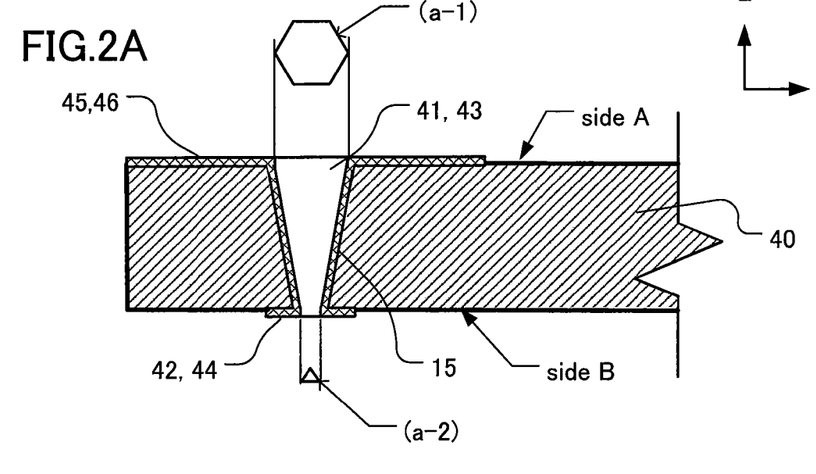
FIG. 2A is a sectional view showing the profile of a first embodiment of a through-hole of a crystal vibrating device.
Figure 2B:
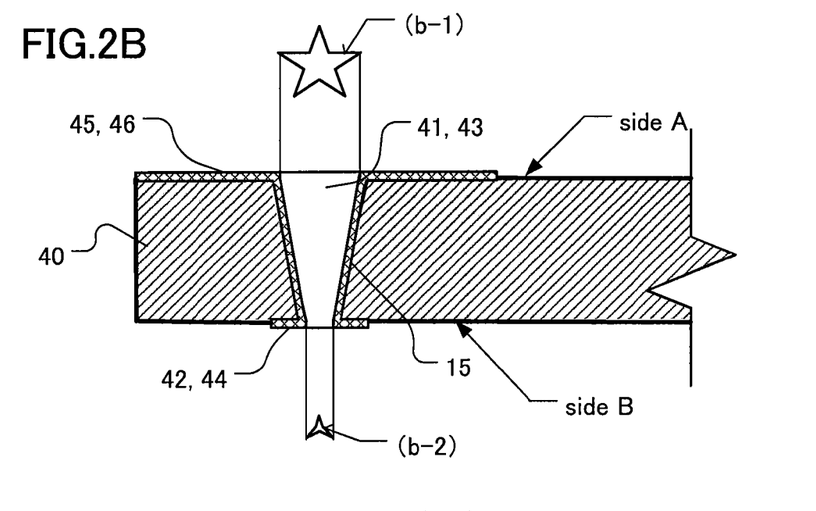
FIG. 2B is a sectional view showing the profile of a second embodiment of a through-hole of a crystal vibrating device.
Figure 2C:
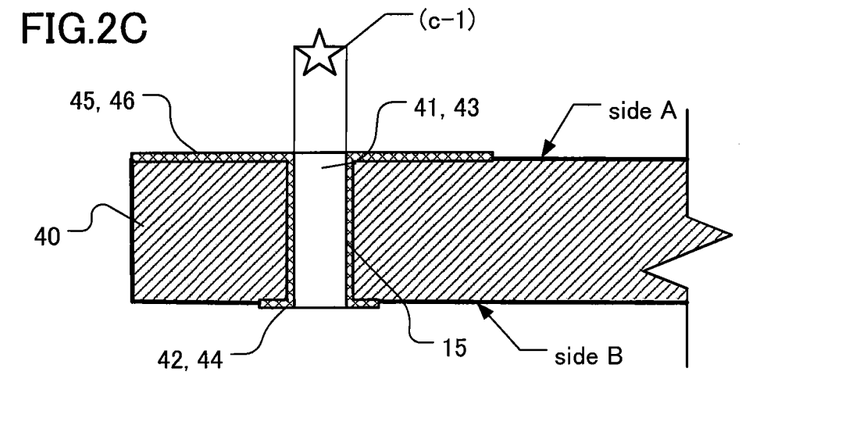
FIG. 2C is a sectional view showing the profile of a third embodiment of a through-hole of a crystal vibrating device.

FIGS. 2A, 2B, and 2C are enlarged elevational sections of exemplary embodiments of through-holes 41, 43 formed in respective bases 40 situated upside-down. Each through-hole has a non-circular transverse section. In FIG. 2A the through-hole 41, 43 has a hexagonal transverse profile (a-1) at side A, a triangular transverse profile (a-2) at side B, and narrows from side A to side B. In FIG. 2B the through-hole 41, 43 has a pentagram (5-pointed star) transverse profile (b-1) at side A, a trigram (3-pointed star) transverse profile (b-2) at side B, and narrows from side A to side B. In FIG. 3C the through-hole 41, 43 has a pentagram transverse profile (c-1) of uniform width from side A to side B.

Referring to the FIG. 2A embodiment, each through-hole 41, 43 extending through the base 40 is shaped substantially as a cone having multi-angular sides and extending between the hexagon transverse profile (a-1) at the side A and the triangular transverse profile (a-2) at the surface B. The width of the cone at side A is greater than the cone at side B. The differently shaped transverse sections of the through-hole 41, 43 at sides A and B facilitate flow of the melted sealing metal into the entire through-holes by capillary action.

Referring now to FIG. 2B, each through-hole 41, 43 extending through the base 40 is shaped substantially as a cone having a pentragram transverse profile (b-1) at side A and a trigram transverse profile (b-2) at side B. The through-holes 41, are formed from both sides A, B concurrently as the concavity 47 is being formed on the surface of the base 40 by wet etching. It is preferable to form the multi-angular cone such that, at mid-depth, the cone has a smoother surface with fewer angles. The multi-angular cone can have a multi-angular transverse profile at side A and a multi-angular star-shaped transverse profile at side B. Alternatively, the transverse profile at side A can be a multi-angular star, while the transverse profile at side B can be a multi-angular polygon. Because of the anisotropy of crystal materials, the respective transverse profiles at sides A and B can be made different even if wet-etching is performed only from side A.

Referring now to FIG. 2C, the first and second through-holes 41, 43 are essentially formed as multi-angular holes having the same transverse profile and the same width throughout. For example, the transverse profile shown in that of a pentragram (c-1), which is identical at both sides A and B. The multi-angular profile of the holes 41, 43 prevent melted sealing metal from being peeled away.

The inner angle of through-holes having a multi-angular transverse profile is narrower so that melted sealing metal can reach everywhere in the through-holes by capillary action. Thus, hermetically sealed crystal devices are reliably manufactured.

Figure 2D:
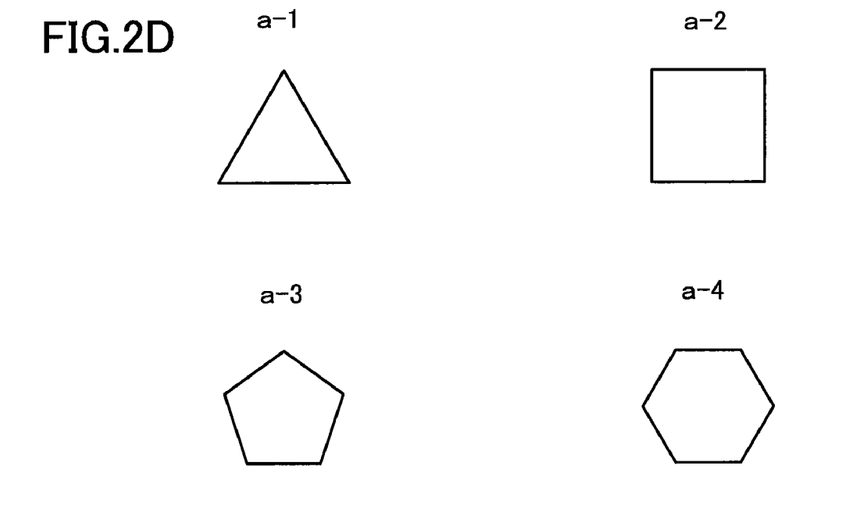
FIG. 2D shows transverse non-circular profiles of four representative examples of multi-angular through-holes.
Figure 2E:
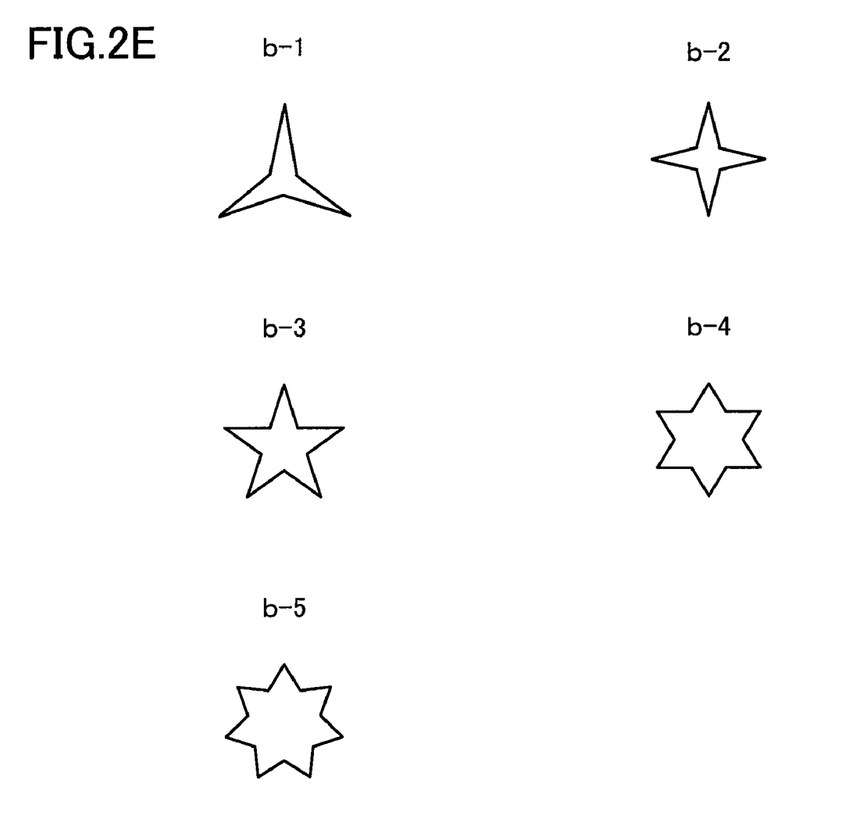
FIG. 2E shows transverse non-circular profiles of five representative examples of multi-angular star-shaped through-holes.

FIGS. 2D and 2E are plan views showing exemplary non-circular transverse-sectional profiles of the first and second through-holes 41, 43. FIG. 2D shows four exemplary multi-angular polygon profiles ranging from triangular (a-1) to hexagon (a-4). Each of the shapes (a-1) to (a-4) is preferably a regular polygon. FIG. 2E shows five exemplary multi-angular star profiles ranging from trigram (3-pointed star) (b-1) to heptagram (7-pointed star) (b-5). The profiles in this group preferably have equi-angular star points. Equal angles ensure that the sealing metal reaches everywhere in the through-hole. From the exemplary shapes shown in FIG. 2D or 2E, or other suitable multi-angular transverse profile, an appropriate profile(s) is selected for the through-holes.

The through-holes can be all formed simultaneously by wet etching or sandblasting. Alternatively, they can be formed one-by-one by drilling or laser processing.

Method for Making Crystal Frame and Tuning-Fork Type Crystal Vibrating Piece

Figure 3A:
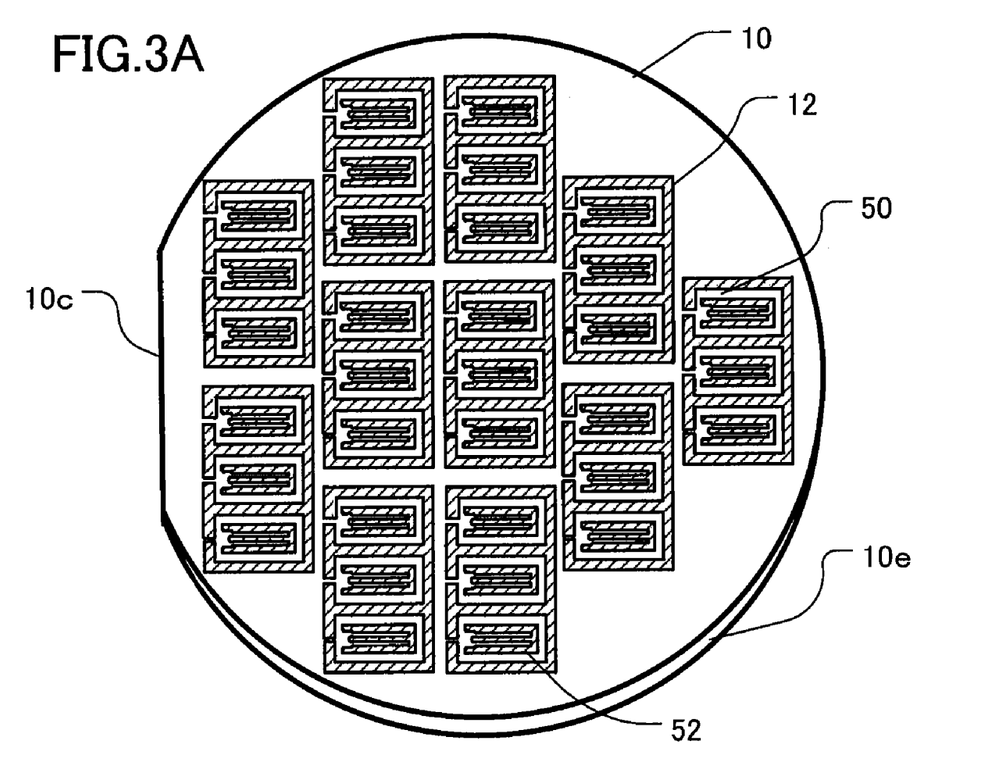
FIG. 3A is a schematic plan view of a crystal wafer 10 on which multiple tuning-fork type crystal vibrating pieces are formed.
Figure 3B:
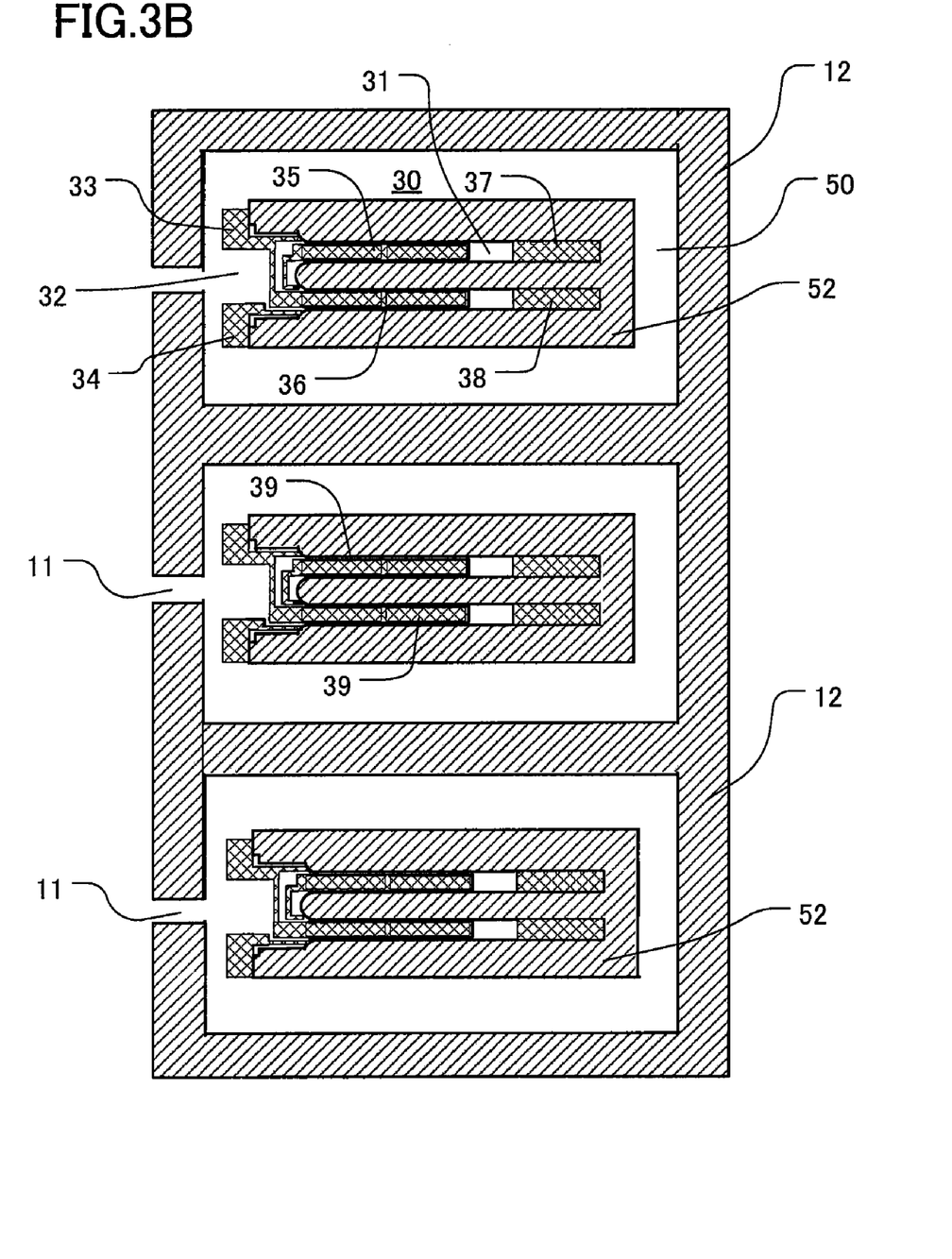
FIG. 3B is an enlarged schematic plan view of three crystal frames 50 of the crystal wafer 10.

FIG. 3A is a schematic plan view of a crystal wafer 10 on which multiple tuning-fork type crystal vibrating pieces 30 are formed, and FIG. 3B shows an exemplary group of three crystal vibrating pieces 30 as formed on the crystal wafer. FIGS. 3A and 3B show that the tuning-fork type crystal vibrating pieces 30 and their respective crystal frames 50 are all formed simultaneously by etching a circular crystal wafer 10. By etching away the voids 12 and spaces 53 (shown with hatching), the tuning-fork type crystal vibrating pieces 30 and frames 50 are formed having designated sizes. In FIG. 3B, a group of three tuning-fork type crystal vibrating pieces 30, with their respective crystal frames 50, is shown as one block; in FIG. 3A, ten blocks are shown on the wafer. On the edge 10e of the circular crystal wafer 10, an orientation flat 10c is formed, which defines the lattice direction of the crystal and also defines axial directions. Although FIG. 3A depicts 33 tuning-fork type crystal vibrating pieces 30, it will be understood that an actual crystal wafer 10 will have hundreds or thousands of tuning-fork type crystal vibrating pieces 30 formed thereon.

In FIG. 3A, the tuning-fork type crystal vibrating pieces 30 and their respective crystal frames 50 are connected to the circular crystal wafer 10 by respective connecting portions 11. By thus forming multiple frames and vibrating pieces on a single crystal wafer 10, multiple crystal frames 50 and their respective vibrating pieces made at one time, rather than frame-by-frame.

Turning now to FIG. 3B, an enlargement is provided of a block of three tuning-fork type crystal vibrating pieces 30 and their crystal frames 50. By etching the voids 12 (hatched), the crystal frames 50 are formed having designated sizes. The connecting portions 11 are formed at one location on the periphery of each frame 50. The connecting portions 11 connect the crystal frames to the crystal wafer 10 to allow simultaneous handling and processing of a large number of frames. The spaces 52 (hatched) define the outline profile of the crystal vibrating pieces 30. The spaces 52 are formed concurrently with formation of the voids 12.

The first and second base electrodes 33, 34, the first and second excitation electrodes 35, 36, and the weights 37, 38 are all formed on each tuning-fork type crystal vibrating piece 30, wherein each vibrating piece 30 is a respective unit of the crystal wafer 10. The grooves 39 are formed on the vibrating arms 31 extending from the base 32. The first and second excitation electrodes 35, 36 are formed on the grooves 39 to lower the CI value.

The first and second base electrodes 33, 34, the first and second excitation electrodes 35, 36 and the weights 37, 38 of the crystal vibrating piece 30 are formed using a photolithography process after depositions of respective metal films by sputtering or vacuum deposition. In a particular embodiment, the metal film of the base electrodes comprises a layer of gold (Au) or silver (Ag) on a sub-layer of chrome (Cr), nickel (Ni), or titanium (Ti) formed by sputtering. In this embodiment, the first and second base electrodes 33, 34 and the first and second excitation electrodes 35, 36 are each formed of a nickel sub-layer 500 to 1000 Ångstroms thick and a gold layer 500 to 1000 Ångstroms thick, yielding a total thickness of 1500 to 2000 Ångstroms.

Method for Making Tuning-Fork Type Crystal Vibrating Piece 100

Figure 4:
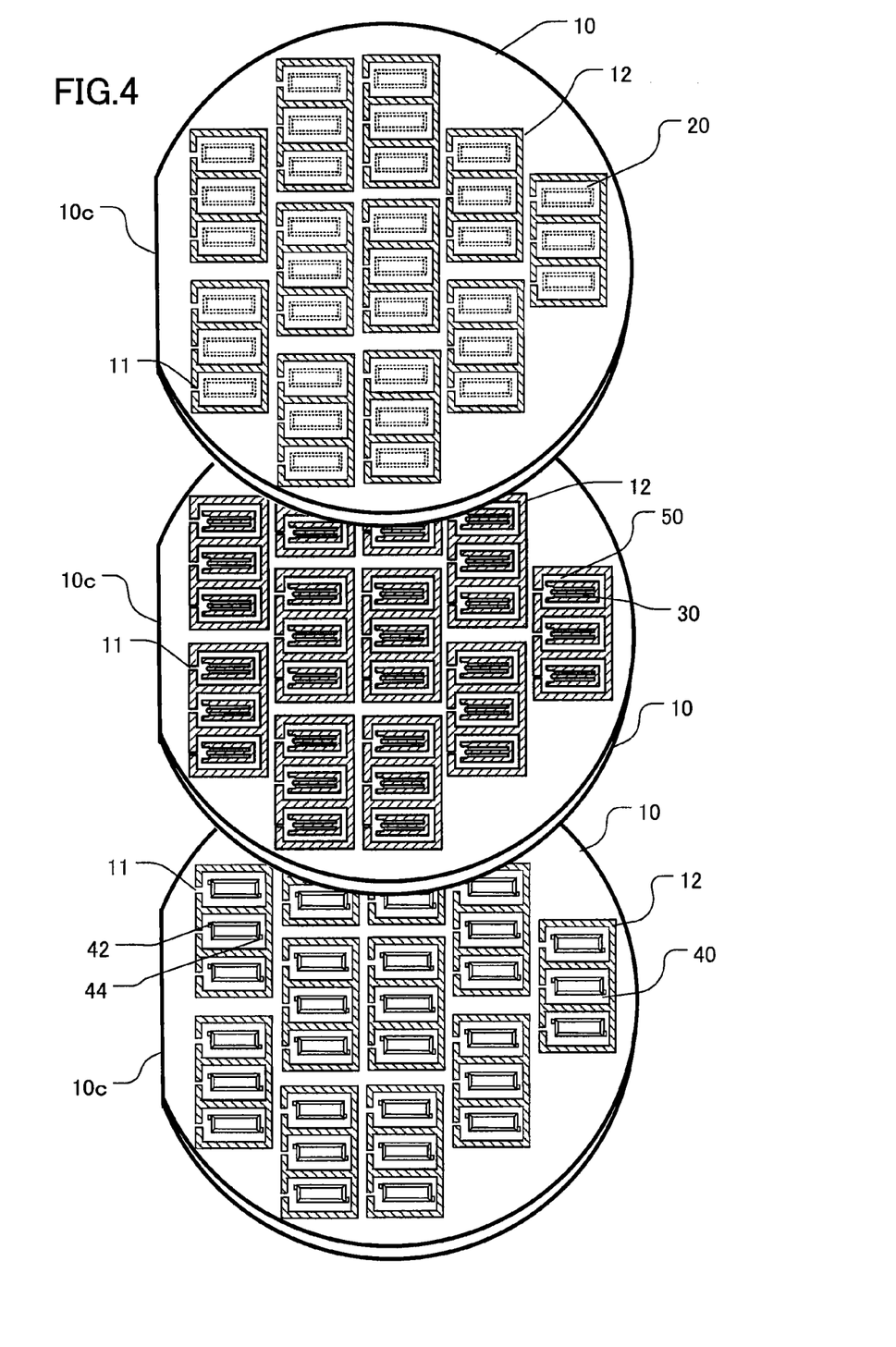
FIG. 4 is a plan view showing the layered configuration of a crystal wafer 10 defining an arrangement and number of lids 20, a crystal wafer 10 defining a corresponding number and arrangement of tuning-fork type crystal vibrating pieces 30 and frames 50, and a crystal wafer 10 defining a corresponding number and arrangement of bases 40.

FIG. 4 shows the crystal wafer 10 on which lids 20 are formed, the crystal wafer 10 on which tuning-fork type crystal vibrating pieces 30 and crystal frames 50 are formed, and the crystal wafer 10 on which the bases 40 are formed. The three wafers 10 are shown in a manner suggesting formation of a three-layer sandwich. The lids 20, bases 40, and frames 50 are each connected to their respective crystal wafers 10 with respective connecting portions 11.

At the time the three wafers are layered relative to each other as shown in FIG. 4, the concavities 27 have already been formed on the lids 20 by crystal etching. Also, the concavities 47 have already been formed on the bases 40, and the first and second connection electrodes 42, 44 have already been formed. As shown in FIGS. 3A and 3B, the first and second base electrodes 33, 34 and the first and second excitation electrodes 35, 36 are formed on the tuning-fork type crystal vibrating piece 30.

The diameter of each crystal wafer 10 is four inches, for example. Using the orientation flat 10c on each wafer, the three wafers are correctly aligned and layered to form a sandwich. The three-wafer sandwich is bonded together by siloxane bonding. As shown in FIGS. 2A-2C, the first and second base electrodes 33, 34 and the first and second connection electrodes 42, 44 are connected securely during the siloxane bonding of the crystal wafers 10.

After bonding the three-wafer sandwich, the connecting portions 11 are cut to complete formation of multiple crystal oscillators 100. Since so-called "packaging" and electrical connection of electrodes can be conducted simultaneously, a large number of devices can be manufactured to achieve mass production.

Various representative embodiments are described above. However, it will be understood by persons of ordinary skill in the art that any of the foregoing embodiments can be modified or changed while remaining within the scope of the invention.

For example, in the crystal oscillator 100, the crystal material can be a piezoelectric single-crystal material such as lithium niobate, as an alternative to synthetic crystal.

The embodiments were described above in the context of tuning-fork type crystal vibrating pieces 30. The present invention also encompasses the manufacture of AT vibrating pieces and/or SAW vibrating pieces instead of crystal vibrating pieces.

What is claimed is:

1. A crystal device, comprising:
    a crystal frame comprising an outer frame and a crystal vibrating piece, the outer frame having a first surface and an opposing second surface, the crystal vibrating piece being coupled to and supported by the outer frame, and the crystal vibrating piece including excitation electrodes;
    a crystal base having a first surface and an opposing second surface, the first surface of the base being bonded to the second surface of the outer frame and including connection electrodes electrically connected to the excitation electrodes of the crystal vibrating piece, the connection electrodes also being electrically connected to respective external electrodes formed on the second surface of the base; and
    a crystal lid bonded to the first surface of the crystal frame;
    wherein the base defines respective through-holes that are electrically connected to respective connection electrodes and to respective external electrodes, the through-holes have at least one non-circular transverse profile, are filled with a sealing material, and have polygonal transverse profiles on the first and second surfaces of the crystal base, the polygonal transverse profile of the first surface of the base being different from the polygonal transverse profile of the second surface of the base.

2. The crystal device of claim 1, wherein the polygonal transverse profile of the through-holes at the first surface of the base has a different size from the polygonal transverse profile of the through-holes at the second surface of the base.

3. The crystal device of claim 1, wherein the at least one polygonal profile includes a star-shaped profile.

4. The crystal device of claim 1, wherein the at least one polygonal profile includes multiple projections extending inwardly.

5. The crystal device of claim 1, wherein the at least one polygonal profile includes multiple projections extending outwardly.

6. The crystal device of claim 1, wherein the crystal lid, crystal frame, and crystal base are bonded to each other by siloxane bonding.

7. The crystal device of claim 6, wherein:
    the crystal lid has a first concavity;
    the crystal base has a second concavity; and
    the crystal vibrating piece is situated between the first concavity and the second concavity.

8. The crystal device of claim 1, wherein:
    the through-holes and the connection electrodes each comprise a first metal layer and a second metal layer formed on the first metal layer; and
    the sealing material in the through-holes is a metal.

9. The crystal device of claim 1, wherein:
    the polygonal transverse profile of the first surface of the base is hexagonally shaped; and
    the polygonal transverse profile of the second surface of the base is triangularly shaped.

10. The crystal device of claim 3, wherein:
    the polygonal transverse profile of the first surface of the base is pentagonally shaped; and
    the polygonal transverse profile of the second surface of the base is triangularly shaped.

* * * * *